(12) United States Patent
Cruz et al.

(10) Patent No.: US 8,388,423 B2
(45) Date of Patent: Mar. 5, 2013

(54) METHOD AND APPARATUS FOR A LOW IMPEDANCE ANTI-RECIRCULATION AIR MOVING INLET DEVICE

(75) Inventors: Ethan E. Cruz, LaGrangeville, NY (US); Maurice F. Holahan, Lake City, MN (US); Roger R. Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 370 days.

(21) Appl. No.: 12/170,940

(22) Filed: Jul. 10, 2008

(65) Prior Publication Data

US 2008/0268764 A1    Oct. 30, 2008

Related U.S. Application Data

(62) Division of application No. 10/965,517, filed on Oct. 14, 2004, now abandoned.

(51) Int. Cl.
*H05K 5/00* (2006.01)
*H05K 7/20* (2006.01)

(52) U.S. Cl. ........................... 454/184; 361/695
(58) Field of Classification Search ................... 454/184
See application file for complete search history.

(56) References Cited

U.S. PATENT DOCUMENTS

| | | | |
|---|---|---|---|
| 2,656,782 A * | 10/1953 | Labus | 454/302 |
| 5,324,167 A * | 6/1994 | Moczadlo et al. | 415/182.1 |
| 5,793,610 A | 8/1998 | Schmitt et al. | |
| 5,890,959 A | 4/1999 | Pettit et al. | |
| 6,031,717 A | 2/2000 | Baddour et al. | |
| 6,174,232 B1 | 1/2001 | Stoll et al. | |
| 6,293,753 B1 | 9/2001 | Pal et al. | |

FOREIGN PATENT DOCUMENTS

| | | |
|---|---|---|
| GB | 2272970 | 1/1994 |
| GB | 2295669 A | 6/1996 |
| GB | 2354316 A | 3/2001 |
| JP | 3175482 | 7/1991 |
| JP | 2001185883 A | 7/2001 |
| JP | 2001257495 A | 10/2008 |
| WO | WO 2004040204 | 5/2004 |

* cited by examiner

*Primary Examiner* — Steven B McAllister
*Assistant Examiner* — Helena Kosanovic
(74) *Attorney, Agent, or Firm* — Cantor Colburn LLP; Dennis Jung

(57) ABSTRACT

An inlet recirculation apparatus for an air moving device includes a housing defined by a wall extending from a base. The base includes an aperture therethrough receptive to alignment with an inlet of the air moving device. A plurality of flaps each pivotally extends radially outwardly from a center pivot to another corresponding pivot disposed around a perimeter of the wall. The center pivot is coaxial with a center of the aperture. Each flap moves to an open position due to air pressure from the air moving device causing air to flow into the inlet wherein each flap pivotally rotates about the center pivot and corresponding pivot at the wall, and moves to a closed position when air pressure from the air moving device ceases wherein a space between contiguous flaps is eliminated when each flap pivotally rotates to the closed position about the center pivot and corresponding pivot at the wall to prevent reverse airflow through the air moving device.

7 Claims, 5 Drawing Sheets

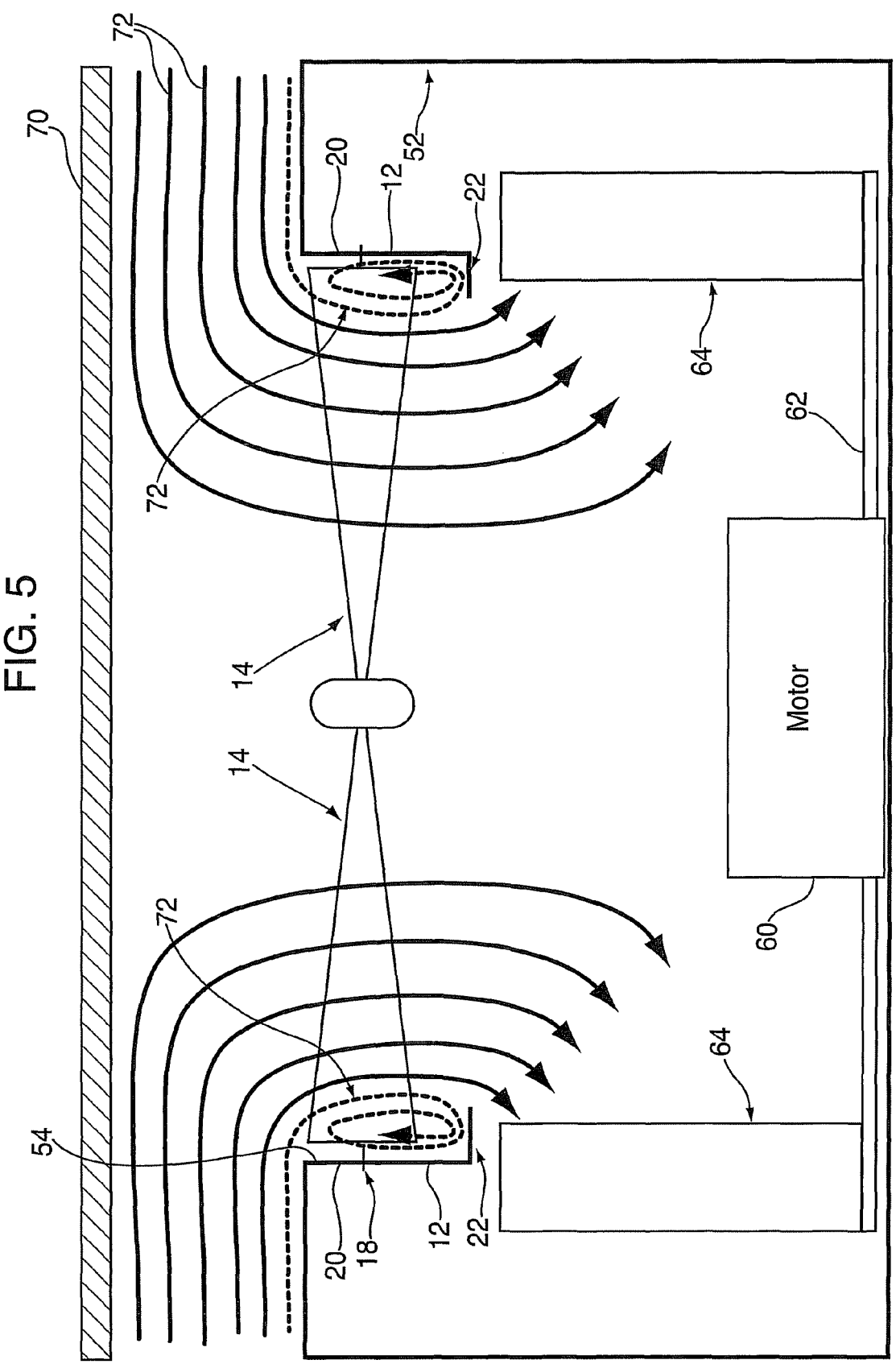

METHOD AND APPARATUS FOR A LOW IMPEDANCE ANTI-RECIRCULATION AIR MOVING INLET DEVICE

CROSS-REFERENCE TO RELATED APPLICATIONS

This non-provisional U.S. patent application is a divisional of pending U.S. patent application Ser. No. 10/965,517, which was filed Oct. 14, 2004, and is assigned to the present assignee.

BACKGROUND OF INVENTION

The present invention relates generally to cooling systems for electrical component enclosures, and in particular to a method and apparatus to prevent flow recirculation during failure of an air moving device used to cool electrical or other components within an enclosure.

Electronic cooling systems designed for high availability or continuous operation often employ redundant air moving devices (e.g., fans or blowers) that are arranged in parallel. This arrangement is used to guard against catastrophic loss of cooling flow in the event of a single blower failure. One problem with this type of parallel blower configuration is that when one blower fails, the pressure difference across the surviving blower pushes air backwards through the failed blower. This reduces the delivered flow rate that would otherwise be available from the surviving blower.

To prevent back flow, the normal practice is to add a flap-type device on the exhaust side of the blowers. Common flapper designs include swinging door flaps and multiple slat vanes. However, the aerodynamic losses created by prior art designs are substantial and must be taken into consideration during system development, because they reduce airflow rate delivery in normal operation. Therefore, although these prior art exhaust side systems prevent recirculation during a blower failure, they inadvertently produce large impedances during normal operation of the blower.

In particular, the volume of air that can be moved through a system can be increased by reducing the total system impedance. By reducing the contribution of the anti-recirulation device losses to the overall system impedance, the system blowers can move more air and thereby increase the cooling capacity of the system, or reduce the acoustic output of the system at similar flow rates achieved at lower blower speeds Accordingly, a method and apparatus is desired that prevents recirculation during a blower failure while reducing aerodynamic losses within the device.

SUMMARY OF INVENTION

The foregoing discussed drawbacks and deficiencies of the prior art are overcome or alleviated by an inlet recirculation apparatus for an air moving device. The apparatus includes a housing defined by a wall extending from a base having an aperture therethrough receptive to alignment with an inlet of the air moving device. A plurality of flaps each pivotally extending radially outwardly from a center pivot to another corresponding pivot disposed about a perimeter of the wall. The center pivot is coaxial with a center of the aperture, wherein each flap moves to an open position due to air pressure from the air moving device causing air to flow into the inlet wherein each flap pivotally rotates about the center pivot and the corresponding pivot. Each flap moves to a closed position when air pressure from the air moving device ceases wherein a space between contiguous flaps is eliminated when each flap pivotally rotates to the closed position about the center pivot and corresponding pivot to prevent reverse airflow through the air moving device.

In another embodiment, an apparatus includes an equipment enclosure having a plurality of air exchange interfaces for exchanging air between the interior and exterior of the enclosure and a plurality of blowers. Each blower resides at one of the air exchange interfaces and includes a blower housing having an inlet and an exhaust outlet. Each exhaust outlet shares a respective common plenum. An inlet recirculation apparatus is disposed at the inlet of each blower. Each inlet recirculation device includes a housing defined by a wall extending from a base having an aperture therethrough receptive to alignment with an inlet of the air moving device. A plurality of flaps each pivotally extending radially outwardly from a center pivot to another corresponding pivot disposed about a perimeter of the wall. The center pivot is coaxial with a center of the aperture, wherein each flap moves to an open position due to air pressure from the air moving device causing air to flow into the inlet wherein each flap pivotally rotates about the center pivot and the corresponding pivot. Each flap moves to a closed position when air pressure from the air moving device ceases wherein a space between contiguous flaps is eliminated when each flap pivotally rotates to the closed position about the center pivot and corresponding pivot to prevent reverse airflow through the air moving device.

A method for an anti-recirculation and low impedance air flow in air moving devices is further provided. The method includes disposing a housing at an inlet of the air moving device. The housing is defined by a wall extending from a base having an aperture therethrough receptive to alignment with the inlet of the air moving device. A plurality of flaps are disposed each pivotally extending radially outwardly from a center pivot to another corresponding pivot disposed about a perimeter of the wall. The center pivot is coaxial with a center of the aperture. Each flap moves to an open position due to air pressure from the air moving device causing air to flow into the inlet wherein each flap pivotally rotates about the center pivot and corresponding pivot. Each flap moves to a closed position when air pressure from the air moving device ceases wherein a space between contiguous flaps is eliminated when each flap pivotally rotates to the closed position about the center pivot and corresponding pivot to prevent reverse airflow through the air moving device.

BRIEF DESCRIPTION OF THE SEVERAL VIEWS OF THE DRAWINGS

Referring to the exemplary drawings wherein like elements are numbered alike in the several FIGURES:

FIG. 5 is a cross section view of the inlet recirculation device operating on a blower in accordance with an exemplary embodiment;

DETAILED DESCRIPTION

Figure 3:
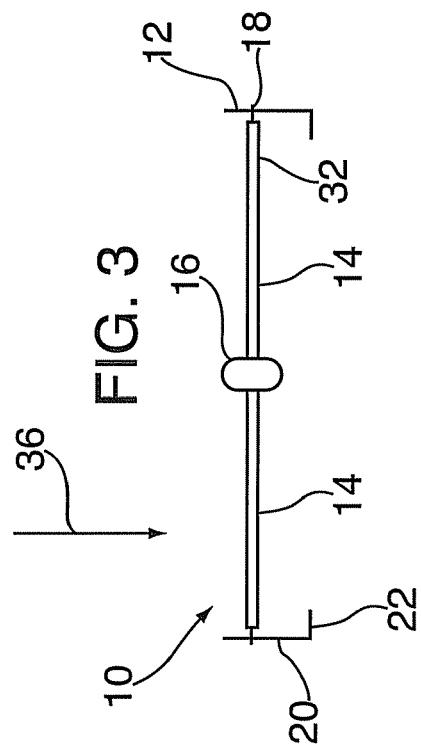
FIG. 3 is a cross section view of the inlet recirculation device of FIG. 1 in a closed position in accordance with an exemplary embodiment.

Referring now to FIGS. 1-4, an inlet recirculation device 10 is illustrated. Inlet recirculation device 10 includes a housing 12 and a plurality of flaps 14 pivotally extending radially outwardly from a center pivot 16 to an opposite pivot 18 extending from the housing 12.

Housing 12 includes a cylindrical wall 20 having a base 22 extending from one end. Base 22 defines an aperture 24 concentric with wall 20, as best seen with reference to FIG. 2, and is receptive to alignment with an inlet of an air moving device discussed more fully below. Although housing 20 and aperture 24 have been described as being round, other geometric shapes are envisioned and not limited to being round.

The plurality of flaps 14 each pivotally extend radially outwardly from center pivot 16 to an end pivot 18 at an opposite end. There is an end pivot 18 associated with each flap 14. End pivots are arranged around an inside perimeter defining wall 20 while center pivot 16 is substantially coaxial with a center of aperture 24. Each flap 14 is adapted to move to an open position indicated in FIGS. 1 and 2 due to air pressure from an air moving device (not shown) disposed below device 10 causing air to flow into the inlet of the air moving device wherein each flap 14 pivotally rotates about center pivot 16 and an associated end pivot 18. Each flap 14 is further adapted to move to a closed position indicated in FIGS. 3 and 4 upon reversal of air flow direction during air moving device failure. More specifically, a space 26 (FIG. 2) between contiguous flaps 14 is eliminated when each flap pivotally rotates to the closed position about center pivot 16 and associated end pivot 18 to prevent reverse airflow through the air moving device as best seen with reference to FIG. 4. Flaps 14 may be disposed in any orientation as the plurality of flaps 14 are able to pivot between the open and closed positions independent of gravity.

Figure 4:
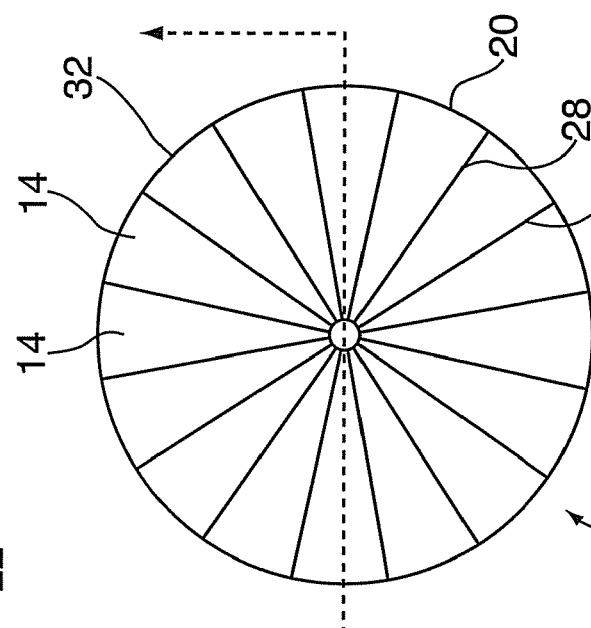
FIG. 4 is a top plan view of the inlet recirculation device of FIG. 3, in the closed position in accordance with an exemplary embodiment.
Figure 1:
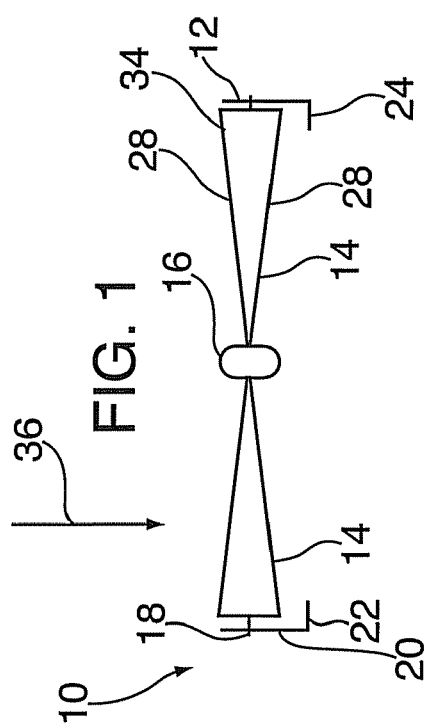
FIG. 1 is a cross section view of an inlet recirculation device in an open position in accordance with an exemplary embodiment.
Figure 2:
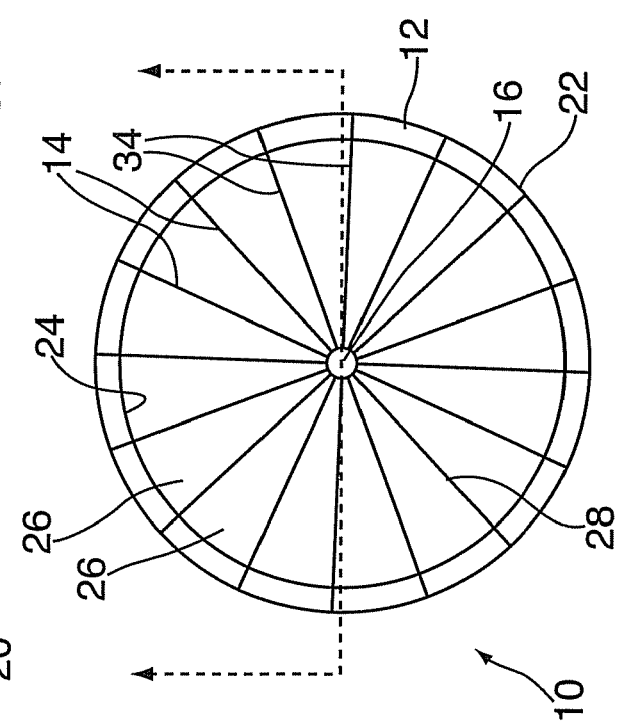
FIG. 2 is a top plan view of the inlet recirculation device of FIG. 1 in the open position in accordance with an exemplary embodiment.

Each flap 14 is triangularly shaped. In an exemplary embodiment as illustrated in FIGS. 1 and 4, each flap 14 forms an isosceles triangle which overlaps its neighboring flap. In this manner, a number of flaps 14 are employed to cover aperture 24 in the closed position. It will be recognized by one skilled in the art that the number and size of flaps may be adjusted so that the clearance requirements for each flap 14 in the open position can be minimized to achieve high packaging density. In particular with reference to FIG. 4, each flap is defined by opposing radial edges 28 defining two common sides of an isosceles triangle while a base 30 thereof is arcuate conforming to a radius defining wall 20. Radial edges 28 defining each flap 14 are distinguished as being upstream and downstream edges that are interconnected in a first plane 32 in the closed position best seen in FIGS. 3 and 4. The upstream and downstream edges 28 are adapted to pivot to a respective plane 34 (FIGS. 1 and 2) substantially normal to the first plane 32 (FIGS. 3 and 4), wherein each respective plane 34 for a corresponding flap 14 extends in a direction corresponding to airflow through the inlet indicated with arrow 36 in FIGS. 1 and 3. Although flap 14 has been described as being triangularly shaped, other geometric shapes are envisioned, and are not limited to being triangular.

Wall 20 of housing 12 may include tabs or protrusions (not shown) extending therefrom proximate end pivots to prevent the flaps from turning more than 90 degrees. However, it will be recognized that other means may be employed for the same purpose. For example, either or both center pivot 16 and end pivot 18 may be adapted to prevent the flaps from turning more than 90 degrees, as will be recognized by one skilled in the pertinent art. With respect to pivots 16 and 18 on either end of flap 14, the area of the flap 14 on one side of the pivot centerline is greater than that on the opposite side, so that a dynamic or static pressure difference across the flap creates a net turning moment in the desired direction of flap opening. This ensures that flaps open, and that all flaps open in the same direction and do not interfere with adjacent flaps. Flaps 14 each overlap along one edge to provide a seal against backflow, without requiring close tolerances.

Figure 6:
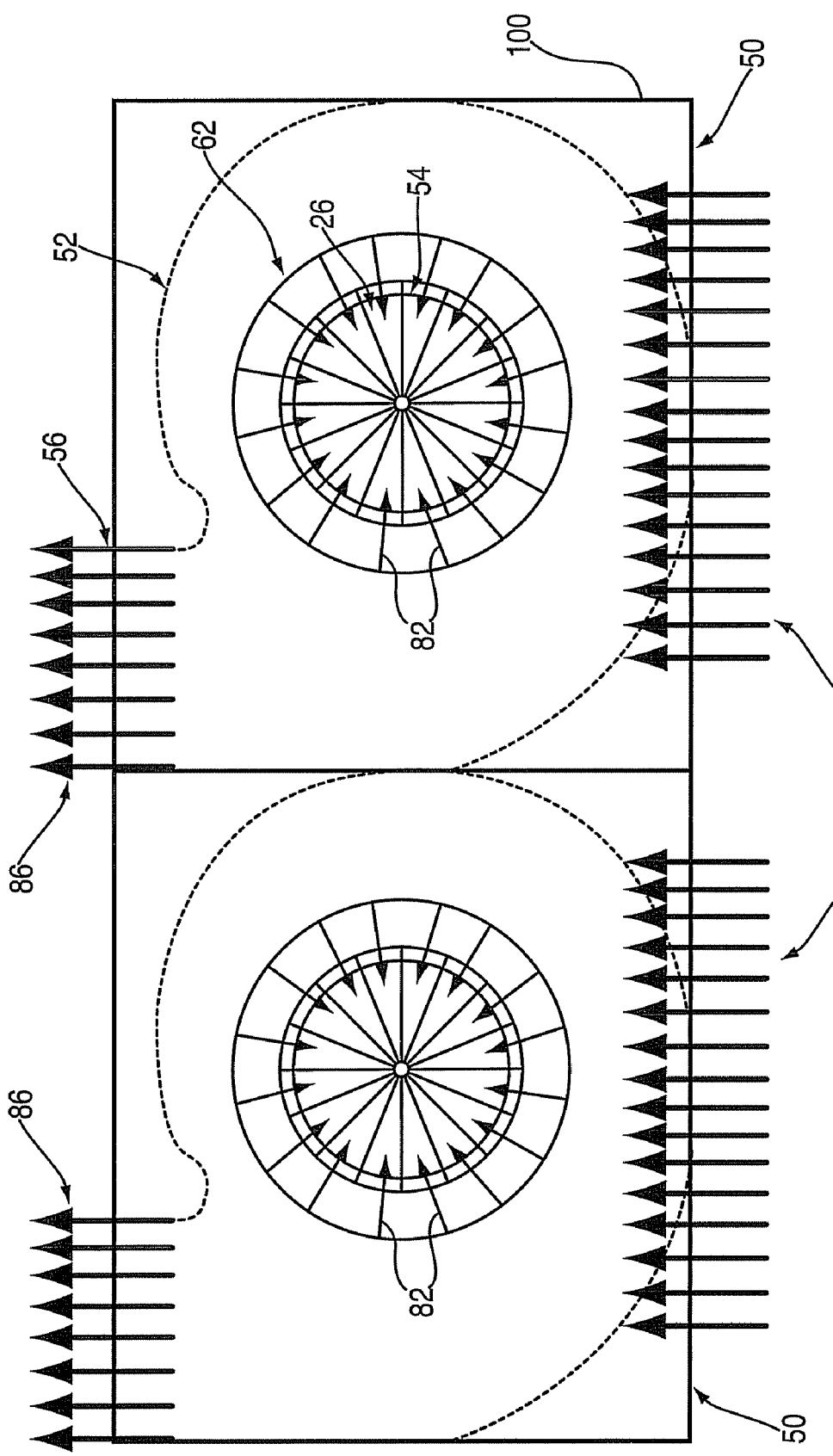
FIG. 6. is a top plan view of two blowers operating in parallel and each using a corresponding inlet recirculation device in accordance with an exemplary embodiment.
Figure 7:
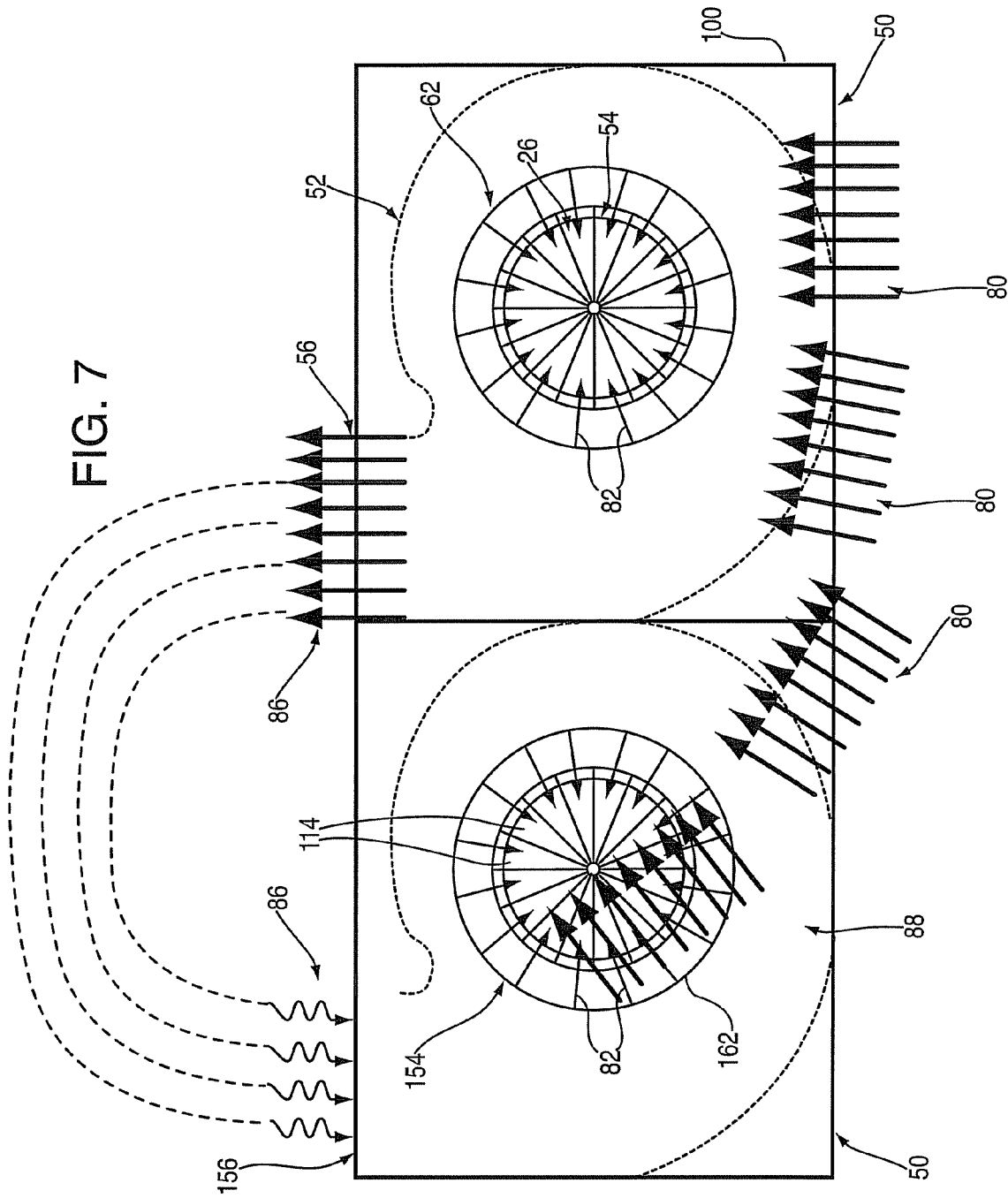
FIG. 7 is a top plan view of the two blowers of FIG. 6 illustrating airflow with a left blower failure in accordance with an exemplary embodiment.

Referring now to FIG. 5, inlet recirculation device 10 is shown employed with an air moving device of blower 50. Blower 50 includes a blower housing 52 having an air inlet 54 and an air exhaust outlet 56 (FIGS. 6 and 7). A blower motor 60 operably coupled to an impeller 62 are disposed within housing 52 to draw air into inlet 54 and exhaust air out exhaust outlet 56. Two impeller blades 64 are illustrated in FIG. 5. Although blower 50 has been described as a centrifugal blower, any kind of blower or fan as air moving device is contemplated.

Blower 50 is installed in an enclosure (not shown) that includes a plate 70 disposed above inlet 54 such that plate 70 defines a horizontal airflow path 72 toward inlet 54. In one embodiment as illustrated, plate 70 is disposed about two inches away from housing 52 that defines inlet 54 and may be part of a blower housing blowers in parallel. Inlet recirculation device 10 is disposed at inlet 54 within housing 52 such that housing 12 is operably coupled to housing 52 of blower 50 so that aperture 24 is substantially concentric with air inlet 54.

Base 22 defining aperture 24 extends radially inward from inlet 54 defined by housing 52. Wall 20 and base 22 define an air pocket that in turn forms a blower inlet ring induced by the air pocket when impeller blades 64 draw air through inlet 54. The air pocket defined by the housing 12 and 22 forms an airflow induced inlet ring 72 which assists the transition of flow approaching inlet 54 from radially inwards to axial then to radially outwards to impeller blade 64. The airflow induced inlet ring 72 eliminates a need to round the housing 12 or 22 defining inlet 54 and enables the flow to turn without separation and high losses. A rounded inlet ring in the region of 20 would be difficult to adequately seal against the arcuate edge of pivoting flap 14 in closed position. The annular inlet ring 22 also reduces the blade tip clearance to impeller blade 64, which is a critical performance advantage in shrouded air movers. Therefore, housing 12 is configured to not only pivotally support the plurality of flaps 14, but also to simultaneously create an air pocket forming a blower inlet ring when the flaps 14 are in the open position as illustrated in FIG. 5. The plurality of flaps 14 disposed at the inlet 14 of blower 50 together with the airflow induced inlet ring 72 contribute to a relative reduction in aerodynamic drag during normal operation of the blower, thereby increasing the cooling capacity of the blower as opposed to having prior art flaps or hinged plates disposed at the exhaust outlet 56. Furthermore, the airflow induced inlet ring 72 allows more air to flow through inlet 54 without using a larger impeller 62. In addition, when blower 50 is one of a plurality of blowers placed in parallel, the plurality of flaps 14 in the closed position prevent air recirculation during a failure of one the blowers as best seen in FIG. 7 and discussed more fully below.

Referring now to FIGS. 6 and 7, top views of two blowers 50 are disposed in parallel within a blower housing 100 to provide cooling in an enclosure (not shown for sake of clarity), such as an enclosure housing electrical components, including a computer, for example. FIG. 6 illustrates airflow into and out of both blowers when both blowers 50 are operational. FIG. 7 illustrates airflow when a left blower 150 as illustrated has failed. Incoming air generally indicated with arrows 80 enters each scroll housing 52 and impellers 62 draw the incoming air 80 through respective inlets 54 indicated generally with arrows 82. Air 82 enters the scroll housing 52 in fluid communication with corresponding exhaust outlets 56 when flaps 14 are open through spaces 26 therebetween contiguous flaps 14. Exhaust air indicated with arrows 86 exit respective outlets 56 into a common plenum (not shown).

Referring now to FIG. 7, when the left blower 150 fails indicated with arrow 88, exhaust air 86 from the right blower 50 in the common plenum enters the exhaust outlet 156 of the left blower 150 since the left impeller 162 is inoperative. The exhaust air 86 flows through the left scroll 156 to left inlet 154 causing left flaps 114 to close, thus preventing recirculation through the left blower 150. In this manner, all incoming air 80 through housing 50 is diverted to inlet 54 of the right blower 50 to continue providing cooling air to components within the enclosure.

Figure 8:
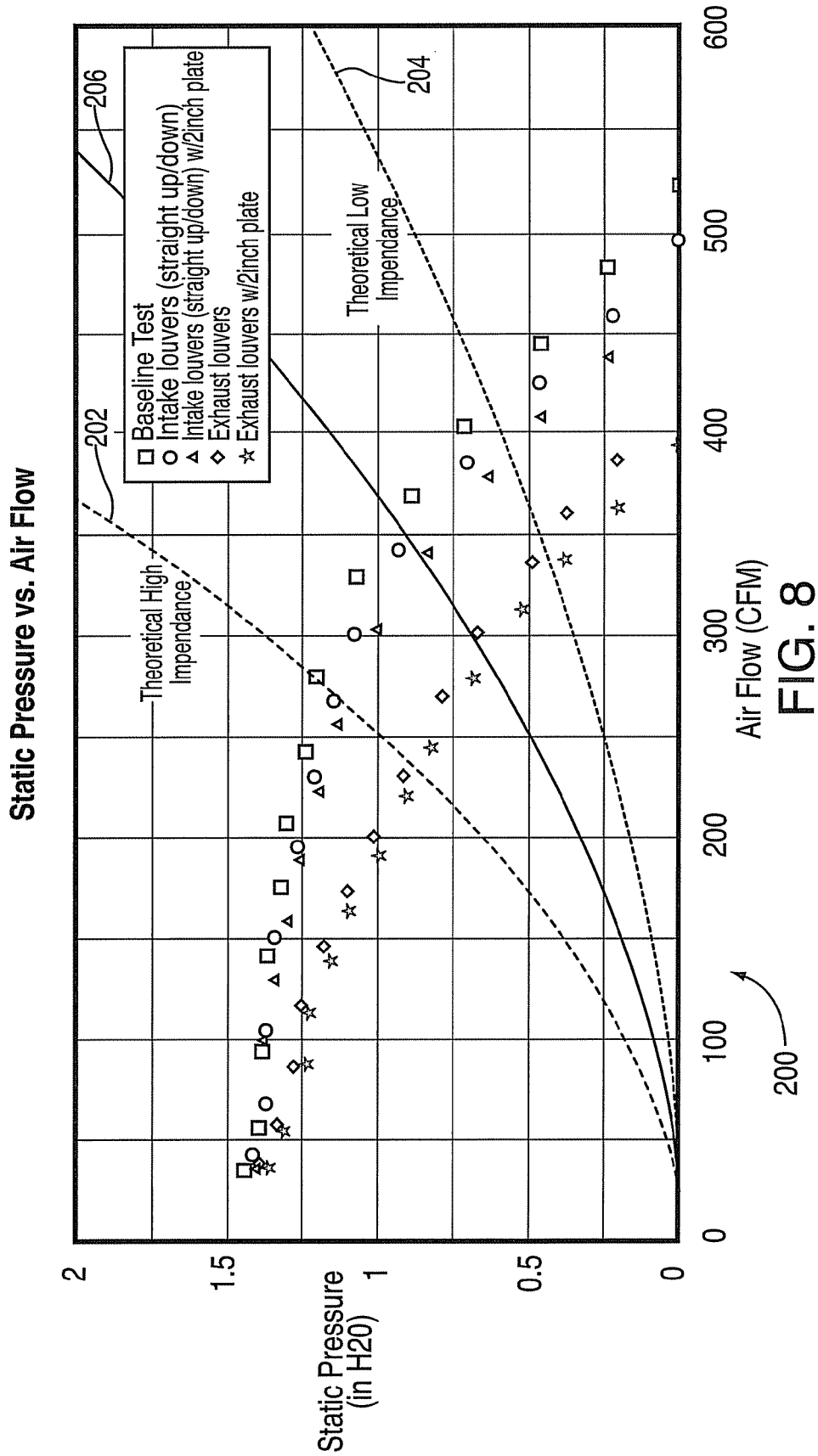
FIG. 8 is a graphical illustration of inlet versus exhaust recirculation device performance data in accordance with an exemplary embodiment.

FIG. 8 shows a graph 200 illustrative of the differences between inlet and exhaust recirculation devices via performance data in accordance with an exemplary embodiment. Graph 200 is a plot of static pressure in inches of water (in $H_2O$) versus air flow in cubic feet per minute (CFM). In particular, graph 200 shows a theoretical high impedance curve at 202 and a theoretical low impedance curve at 204 with a normal operating expected impedance curve illustrated at 206 intermediate high and low curves 202 and 204, respectively. It will be recognized by one skilled in the pertinent art that as the air flow increases, the static pressure increases as well.

FIG. 8 illustrates that intake louvers or flaps 14 in an open position, with or without plate 70, move more air than when using exhaust louvers or flaps, with or without plate 70. For example, referring to the normal expected operating curve 206, it is seen that when flaps 14 are employed at inlet 54, with or without plate 70, about 350 CFM result compared to about 300 CFM when louvers or flaps are employed at the exhaust outlet 56.

The above described inlet recirculation device employed in blowers placed in parallel reduces the impedance of the recirculation device during normal operation and prevents recirculation during a blower failure. The housing of the recirculation flaps act not only as a support to allow rotation of the flaps, but also simultaneously creating air pockets that form a blower inlet ring. The reduced impedance and the airflow induced inlet ring both contribute to increasing the cooling capacity of the blower while the flaps disposed at the air inlet prevent air recirculation during a blower failure. The reduced impedance also reduces the rotational speed required to maintain a desired airflow which reduces the air mover's power consumption and acoustic noise.

The recirculation flaps allow passive operation thereof by responding to the pressure differential across the enclosure in which the blowers are employed. When air is flowing into the blower inlet, the flaps are in an open position and create minimal impedance to the air flow. When air flows out of the blower inlet, as in recirculation indicative of a blower failure, the flaps rotate to a closed position to prevent recirculated air flowing through the blower.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the claims.

The invention claimed is:

1. An apparatus comprising:
a blower including a blower housing having an air inlet and an air exhaust outlet; and
an inlet recirculation device disposed at said air inlet of the blower, the inlet recirculation device comprising:
a housing defined by a wall extending away from a base in a direction parallel to the rotational axis of the blower, said base extending radially inward from the wall toward the axis of rotation of the blower and defining an aperture therethrough receptive to alignment with an inlet of the blower; and
a plurality of flaps each pivotally extending radially outwardly from a center pivot to another corresponding pivot disposed about a perimeter of said wall, said center pivot coaxial with a center of said aperture,
wherein said each flap moves to an open position due to air pressure from the blower causing a substantially unimpeded airflow to pass through the air inlet wherein said each flap pivotally rotates about said center pivot and said corresponding pivot, and a closed position allowing substantially no airflow when air pressure from the blower ceases wherein a space between contiguous flaps is eliminated when said each flap pivotally rotates to said closed position about said center pivot and said corresponding pivot to prevent reverse airflow through the blower and wherein said base and said wall form a pocket inducing recirculation of incoming air.

2. The apparatus of claim 1, wherein said each flap is formed as an isosceles triangle, said plurality of flaps may be disposed in any orientation as said plurality of flaps pivot between the open and closed positions independent of gravity.

3. The apparatus of claim 1, wherein said base defining said aperture and extending from said wall defines an air pocket receptive to forming an airflow induced inlet ring, said induced inlet ring reducing turbulence of air flow into the inlet to the blower.

4. The apparatus of claim 1, wherein each flap will have upstream and downstream edges that are interconnected in a first plane in the closed position, wherein the upstream and downstream edges are adapted to pivot to a respective plane substantially normal to the first plane, and the respective plane for said flap extending in a direction corresponding to airflow through the inlet.

5. A method for an anti-recirculation and low impedance air flow in air moving devices, the method comprising:
disposing a housing at an inlet of the a blower, the housing being defined by a wall extending away from a base in a direction parallel to the rotational axis of the blower, said base extending radially inward from the wall toward the axis of rotation of the blower and defining an aperture therethrough receptive to alignment with the air inlet of the blower; and disposing a plurality of flaps each pivotally extending radially outwardly from a center pivot to another corresponding pivot disposed about a perimeter of said wall, said center pivot coaxial with a center of said aperture, wherein said each flap moves to an open position due to air pressure from the air moving device causing a substantially unimpeded airflow to pass through the air inlet wherein said each flap pivotally rotates about said center pivot and said corresponding pivot, and a closed position allowing substantially no airflow when air pressure from the blower ceases wherein a space between contiguous flaps is eliminated when said each flap pivotally rotates to said closed position about said center pivot and said corresponding pivot to prevent reverse airflow through the blower and wherein said base and said wall form a pocket inducing recirculation of incoming air.

6. The method of claim 5, wherein said base defining said aperture and extending from said wall defines an air pocket receptive to forming an airflow induced inlet ring, said induced inlet ring reducing turbulence of air flow into the inlet to the blower.

7. The method of claim 6, wherein the airflow induced inlet ring eliminates rounding the inlet to the blower to transition flow through an axial-radial-axial turn while reducing blade tip clearance, thereby reducing overall aerodynamic losses associated with separated flow.

* * * * *